(12) United States Patent
Kobayashi

(10) Patent No.: US 8,675,430 B2
(45) Date of Patent: Mar. 18, 2014

(54) SEMICONDUCTOR STORAGE DEVICE

(75) Inventor: Hiroyuki Kobayashi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 219 days.

(21) Appl. No.: 13/279,425

(22) Filed: Oct. 24, 2011

(65) Prior Publication Data

US 2012/0147685 A1    Jun. 14, 2012

(30) Foreign Application Priority Data

Dec. 9, 2010    (JP) .................................. 2010-274447

(51) Int. Cl.
*G11C 7/00*    (2006.01)

(52) U.S. Cl.
USPC ....... 365/200; 365/201; 365/226; 365/185.09

(58) Field of Classification Search
USPC .............................. 365/200, 201, 185.09, 226
See application file for complete search history.

(56) References Cited

U.S. PATENT DOCUMENTS

| | | | |
|---|---|---|---|
| 6,373,776 B2 | 4/2002 | Fujisawa et al. | |
| 8,072,827 B2 * | 12/2011 | Wakimoto | 365/200 |
| 2003/0112664 A1 * | 6/2003 | Yamano | 365/189.07 |

FOREIGN PATENT DOCUMENTS

| | | |
|---|---|---|
| JP | 2001-135075 A | 5/2001 |
| JP | 2004-342260 A | 12/2004 |
| JP | 2010-27201 A | 2/2010 |

* cited by examiner

*Primary Examiner* — Vu Le
*Assistant Examiner* — Han Yang
(74) *Attorney, Agent, or Firm* — Fujitsu Patent Center

(57) ABSTRACT

A semiconductor storage device including an open bit line core architecture includes a plurality of array areas, wherein each of the array areas includes two redundant array blocks, a plurality of real array blocks, and a power supply capacity control unit. The two redundant array blocks contain only redundant word lines and located in edge portions at both ends of the array area, and the plurality of real array blocks contain only real word lines and arranged between the two redundant array blocks by interposing a sense amplifier in alternating fashion. The power supply capacity control unit is configured to increase power supply capacity for a first array area when word line redundancy switching is performed in the first array area to replace any one of the real word lines with a corresponding one of the redundant word lines.

14 Claims, 19 Drawing Sheets

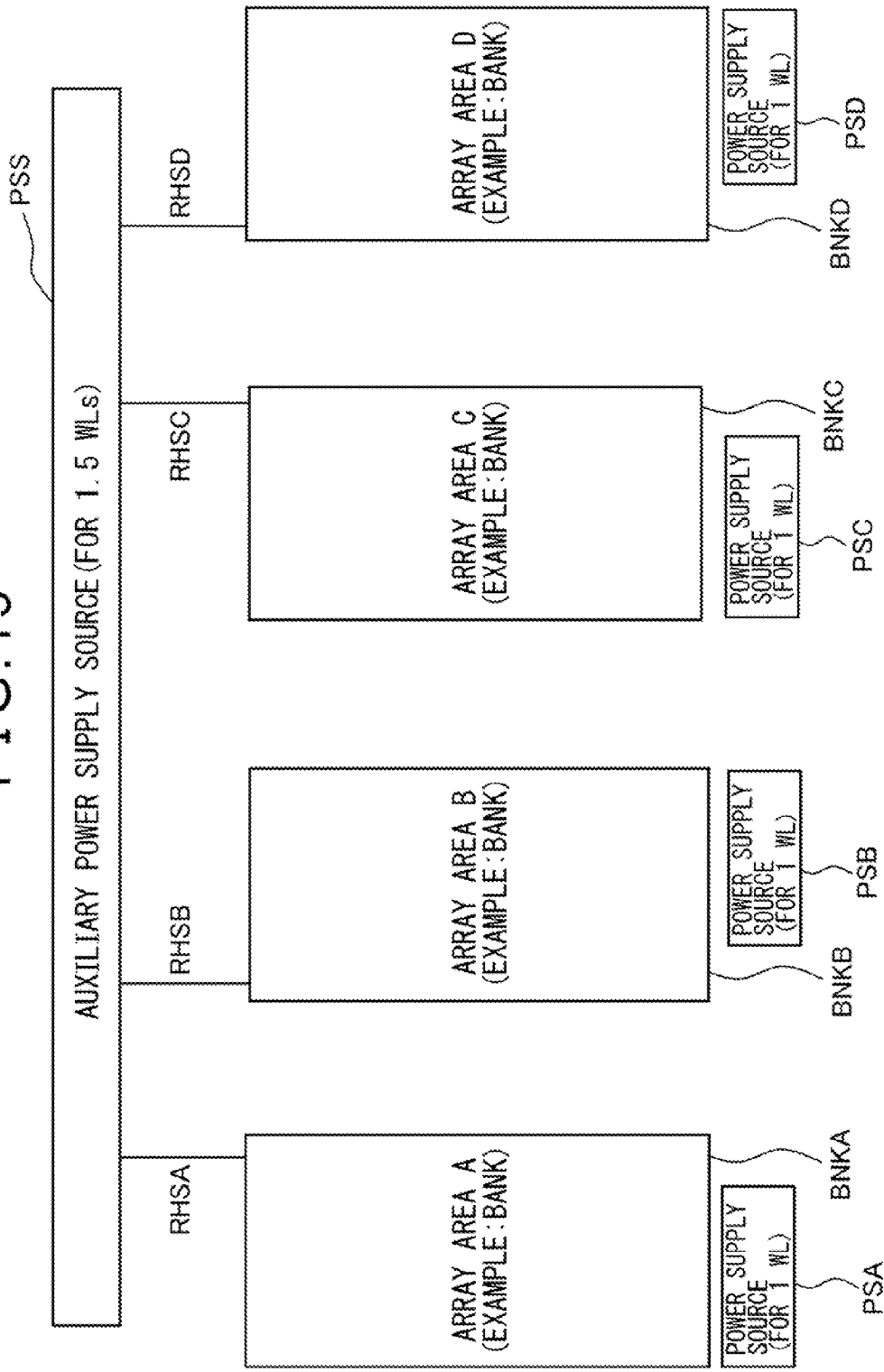

SEMICONDUCTOR STORAGE DEVICE

CROSS REFERENCE TO RELATED APPLICATION

This application is based upon and claims the benefit of priority of the prior Japanese Patent Application No. 2010-274447, filed on Dec. 9, 2010, the entire contents of which are incorporated herein by reference.

FIELD

The embodiments discussed herein are related to a semiconductor storage device.

BACKGROUND

In recent years, semiconductor storage devices (for example, synchronous dynamic random access memories (SDRAMs)) have been used in computers and other information processing apparatus or in various kinds of electronic products such as digital video cameras and digital still cameras.

Further, with the trend toward higher miniaturization and integration levels, semiconductor storage devices employing an open bit line core architecture have come to be provided.

Semiconductor storage devices employing the open bit line core architecture are provided with redundant word lines in addition to real word lines, with provisions made so that the semiconductor storage device may be shipped from the factory after replacing any defective real word line with a redundant word line, for example, at the time of a wafer test or a pre-shipment test.

Here, the real word lines means the word lines for real cells, and the redundant word lines means the word lines for redundant cells.

However, in the prior art, the arrangement of the real word lines and redundant word lines and the power management for the same have not been adequate, and have led to an increase in the area of the memory cell array (core) or an increase in the area and capacity of the power supply used.

For example, in a prior art system, when a block other than those located at an edge of the cell array is selected, one word line rises, but when a block located at an edge is selected, two word lines rise. Therefore, the power supply circuit needs to be designed so that there will be no problem if two word lines rise simultaneously, and this has led to an increase in the area of the power supply.

It has also been practice to provide redundant cells in the bit line direction and to replace any defective cell with a redundant cell, for example, at the time of a wafer test or a pre-shipment test, but since this is not relevant to the present embodiments, no description thereof will be given in this specification.

In the related art, there have been proposed various kinds of semiconductor storage devices employing the open bit line core architecture.

Patent Document 1: Japanese Laid-open Patent Publication No. 2010-027201
Patent Document 2: Japanese Laid-open Patent Publication No. 2001-135075
Patent Document 3: Japanese Laid-open Patent Publication No. 2004-342260

SUMMARY

According to an aspect of the embodiments, a semiconductor storage device, including an open bit line core architecture, includes a plurality of array areas. Each of the array areas includes two redundant array blocks, a plurality of real array blocks, and a power supply capacity control unit.

The two redundant array blocks contain only redundant word lines and located in edge portions at both ends of the array area, and the plurality of real array blocks contain only real word lines and arranged between the two redundant array blocks by interposing a sense amplifier in alternating fashion.

The power supply capacity control unit is configured to increase power supply capacity for a first array area when word line redundancy switching is performed in the first array area to replace any one of the real word lines with a corresponding one of the redundant word lines.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 19 is a block diagram for explaining the semiconductor storage device according to a fourth embodiment.

DESCRIPTION OF EMBODIMENTS

Before describing the embodiments of a semiconductor storage device in detail, the semiconductor storage device and problems associated with it will be described below with reference to FIG. 1 to FIG. 5.

Figure 1:
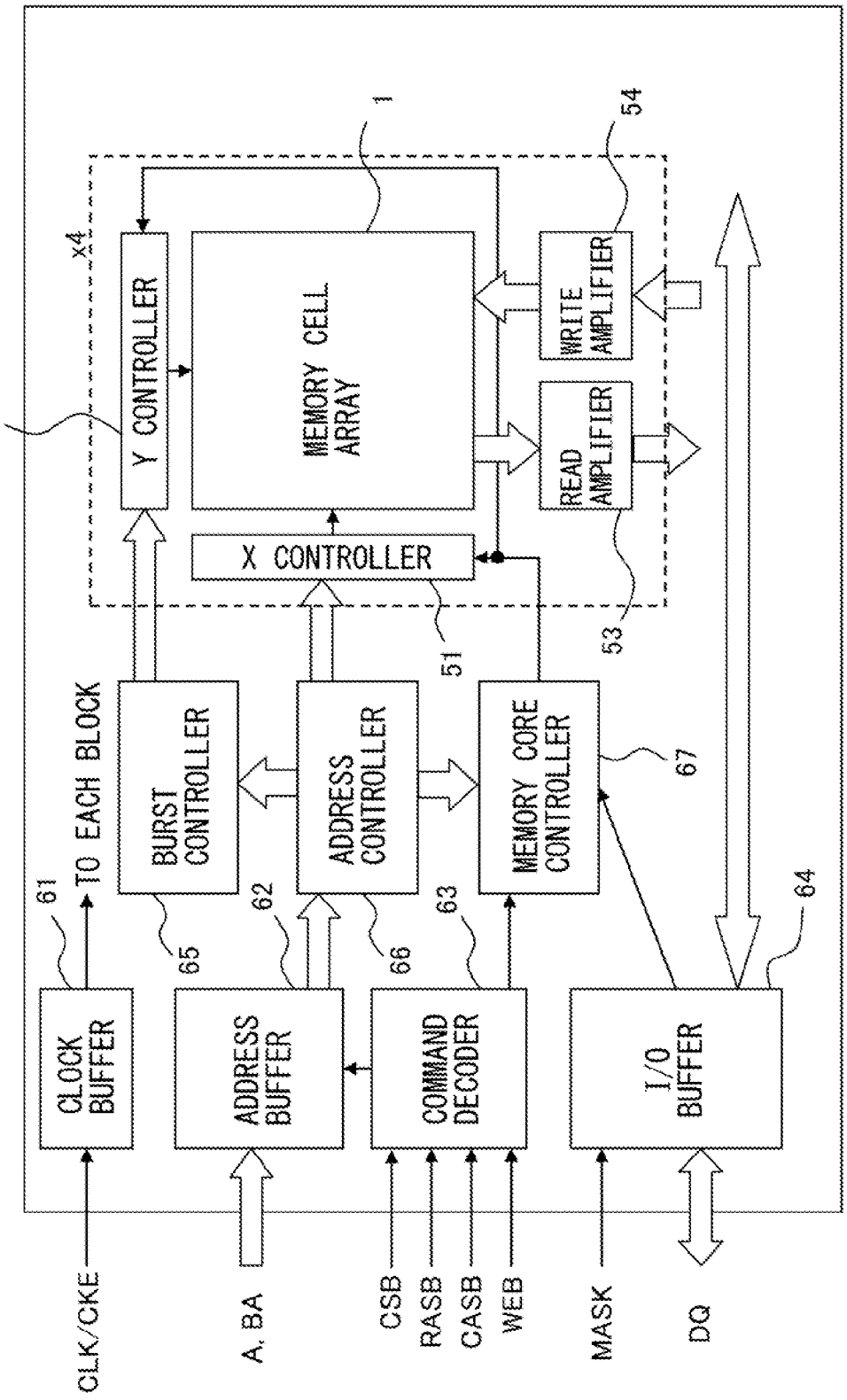
FIG. 1 is a block diagram illustrating one example of a semiconductor storage device.

FIG. 1 is a block diagram illustrating one example of a semiconductor storage device. In FIG. 1, reference numeral 1 is a memory cell array (core), 51 is an X controller, 52 is a Y controller, 53 is a read amplifier, and 54 is a write amplifier.

Further, reference numeral 61 is a clock buffer, 62 is an address buffer, 63 is a command decoder, 64 is an I/O buffer, 65 is a burst controller, 66 is an address controller, and 67 is a memory core controller.

FIG. 1 illustrates an example of a four-bank configuration constructed from four banks with the memory cell array 1, X controller 51, Y controller 52, read amplifier 53, and write amplifier 54 constituting one bank.

As illustrated in FIG. 1, clock CLK and clock enable CKE are input to the clock buffer 61, and address A and bank address BA are input to the address buffer 62.

Further, chip select CSB, row address strobe RASB, column address strobe CASB, and write enable WEB are input to the command decoder 63. Here, the suffix "B" in each signal name indicates that the signal is a low enable signal.

On the other hand, input mask (output disable) MASK is input to the I/O buffer 64 so that data DQ will be transferred smoothly between the semiconductor storage device (SDRAM) and another circuit. Here, the clock enable CKE controls, for example, an internal clock generator, and an output clock of the clock buffer 61 is supplied to each circuit block.

The address controller 66 selects a bank in accordance with the signal from the address buffer 62, and supplies the address in the bank to the memory core controller 67; the address controller 66 is also responsible for controlling the burst controller 65.

The burst controller 65 is used, for example, in a burst mode that makes fast memory access possible, to automatically strobe column addresses by the same row address and thereby select bit lines BLs in succession.

The memory core controller 67 controls the memory cell array 1 by receiving the signal (command) from the command decoder 63, the signal (mask data) from the I/O buffer 64, and the signal (address) from the address controller 66.

That is, the memory core controller 67 selects a word line WL and a bit line BL (BLB) through the X controller 51 and Y controller 52 in each bank, and accesses the memory cell MC at the designated address.

The read amplifier 53 reads data from the accessed memory cell MC, and outputs the data as data DQ via the I/O buffer 64; on the other hand, the write amplifier 54 writes the input data DQ, received via the I/O buffer 64, into the accessed memory cell MC.

Figure 2:
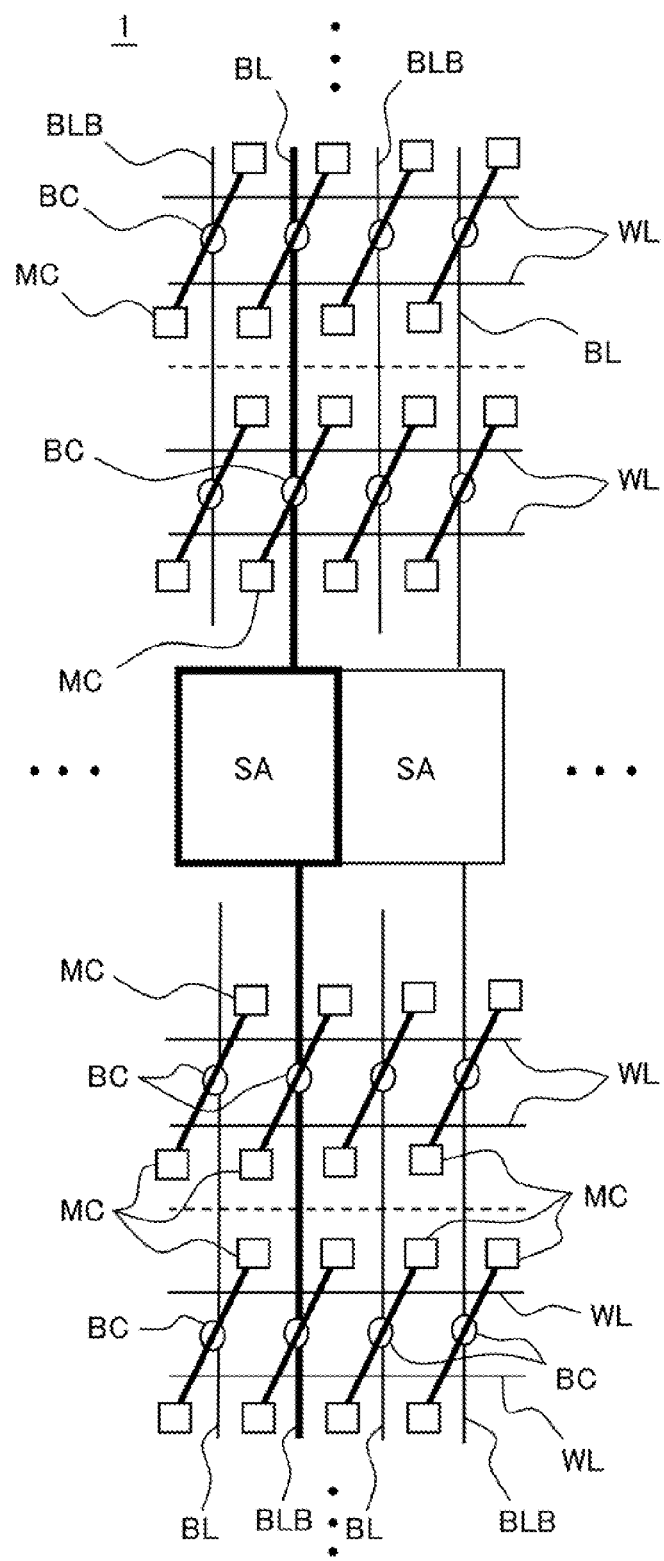
FIG. 2 is a diagram illustrating a portion of a memory cell array employing an open bit line core architecture.
Figure 3:
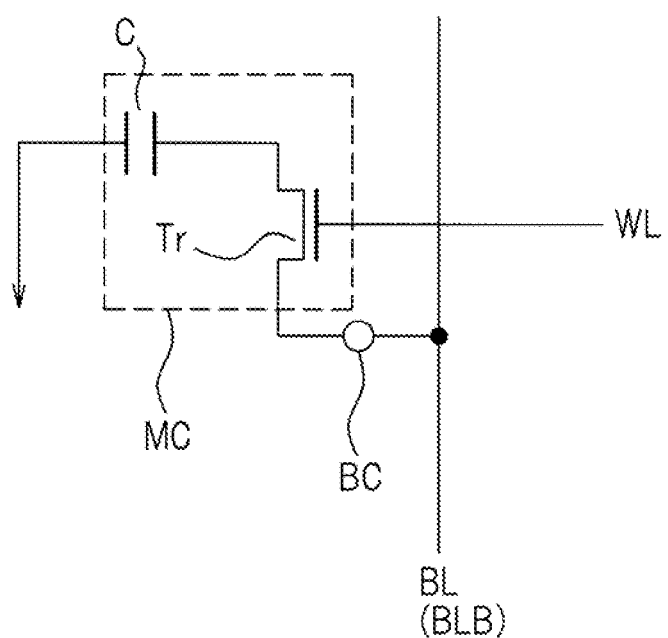
FIG. 3 is a diagram illustrating one example of a memory cell in the memory cell array depicted in FIG. 2.
Figure 4:
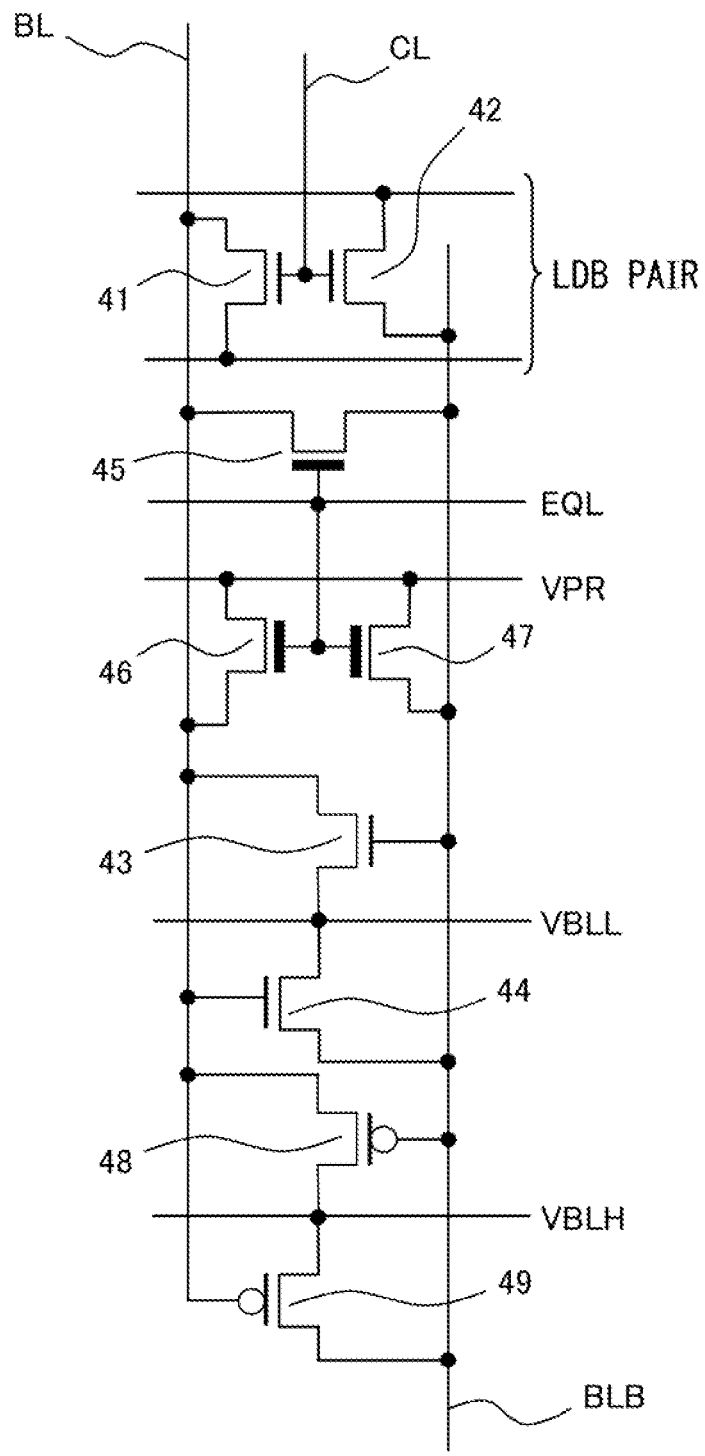
FIG. 4 is a circuit diagram illustrating one example of a sense amplifier in the memory cell array depicted in FIG. 2.

FIG. 2 is a diagram illustrating a portion of a memory cell array employing the open bit line core architecture, and FIG. 3 is a diagram illustrating one example of a memory cell in the memory cell array depicted in FIG. 2. Further, FIG. 4 is a circuit diagram illustrating one example of a sense amplifier in the memory cell array depicted in FIG. 2.

As illustrated in FIG. 2, a bit line BL on one side (in the upper part of FIG. 2) and a bit line BLB on the other side (in the lower part of FIG. 2) of a sense amplifier SA are arranged so as to alternate with a bit line BLB and a bit line BL on the respective sides of its adjacent sense amplifier SA.

A memory cell MC is formed at the intersection between each bit line BL or BLB and word line WL, and the memory cells MCs are thus arranged in a matrix array.

As illustrated in FIG. 3, each memory cell MC includes, for example, an n-channel MOS transistor Tr and a capacitor C. The gate of the transistor Tr is coupled to the word line WL, the drain is coupled to the bit line BL (BLB) via a bit line contact BC, and the source is coupled to a low voltage power supply line via the capacitor C.

As illustrated in FIG. 4, the sense amplifier SA includes a plurality of nMOS transistors 41 to 47 and pMOS transistors 48 and 49.

In FIG. 4, reference character EQL indicates a bit line equalizing signal, and VPR a power supply line of a bit line precharge level (for example, 0.6 V). When the signal EQL goes high, the bit lines BL and BLB are directly short-circuited and raised to the precharge level VPR.

On the other hand, reference character VBLL indicates a power supply line of a bit line low level (for example, 0 V), and VBLH a power supply line of a bit line high level (for example, 1.2 V).

Here, the bit lines BL and BLB are coupled to a local data bus LDB pair via the transistors 41 and 42 controlled by a column select signal CL. Then, the readout data is transferred into the I/O buffer 64 via the local data bus LDB pair and via the earlier described read amplifier 53.

Figure 5:
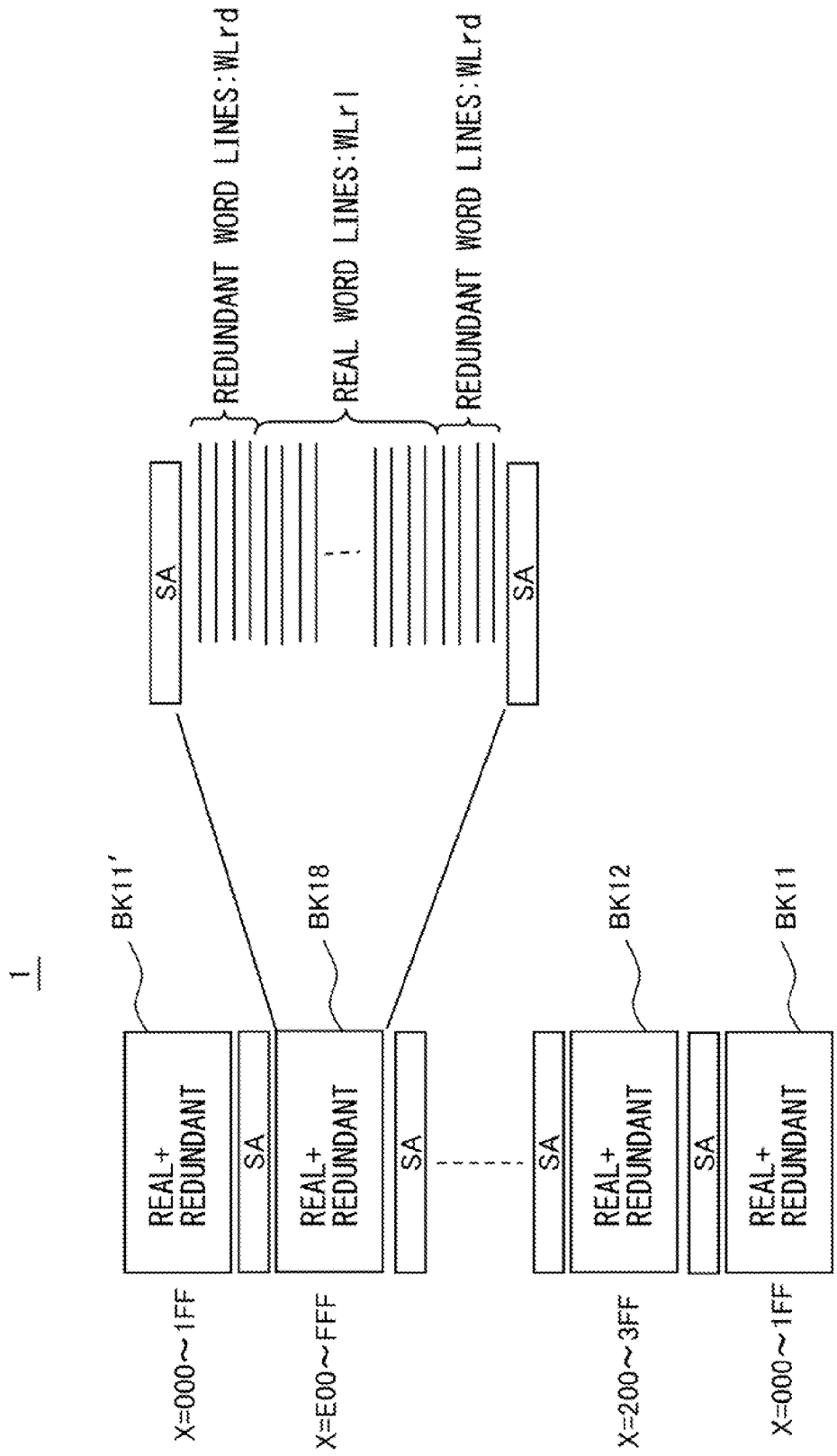
FIG. 5 is a diagram for explaining the open bit line core architecture and power management.

FIG. 5 is a diagram for explaining the open bit line core architecture and power management for the case where the core (memory cell array) 1 is constructed from nine array blocks.

More specifically, the memory cell array 1 contains eight array blocks BK11 to BK18, with addresses X=000 to 1FF, 200 to 3FF, 400 to 5FF, 600 to 7FF, 800 to 9FF, A00 to BFF, C00 to DFF, and E00 to FFF, respectively, and an additional array block BK11' with duplicate addresses X=000 to 1FF.

That is, in the memory cell array 1 employing the open bit line core architecture, the array blocks BK11 and BK11' having the same addresses X=000 to 1FF are located at both edges thereof.

Each of the array blocks BK11 to BK18 and BK11' contains both real word lines WLrl and redundant word lines WLrd. Here, the real word lines WLrl means the word lines for real cells, and the redundant word lines WLrd means the word lines for redundant cells.

More specifically, in the array block BK18 with the addresses X=E00 to FFF, for example, a set of redundant word lines WLrd is located in each edge portion near a sense amplifier, and the real word lines WLrl are arranged between the two sets of redundant word lines WLrd.

In the two array blocks BK11 and BK11' having the same addresses X=000 to 1FF, located at both edges, each memory cell MC is coupled to only one or the other of the bit lines BL and BLB of the sense amplifier SA.

That is, since one sense amplifier is shared between two adjacent array blocks, as explained with reference to FIG. 2, it follows that, in the array blocks BK11 and BK11' located at both edges, only half of the memory cells are used.

As a result, when any one of the addresses X=000 to 1FF is selected, the two corresponding word lines in the respective array blocks BK11 and BK11' having the same addresses X=000 to 1FF, located at both edges, are simultaneously raised for operation. When an address other than the above addresses is selected, only one word line needs to be raised.

In this way, in the semiconductor storage device employing the open bit line core architecture depicted in FIG. 5, since two word lines are raised when an address in an array block located at an edge is selected, the power supply needs to be designed to have the capacity capable of handling such a situation.

Furthermore, when designing the power, there has also been a need to consider the case where addresses in an array block located at an edge are successively selected, and this has led to not only an increase in the capacity of the power supply used but also an increase in the area it occupies (power area). Further, since each array block contains redundant word lines in addition to the real word lines, there has also been the problem that the area of the memory cell array (core) increases.

As previously described, in the semiconductor storage device, it is also practice to provide redundant cells in the bit line direction and to replace any defective cell with a redundant cell, but since this is not relevant to the present embodiments, no description thereof will be given in this specification.

Figure 6:
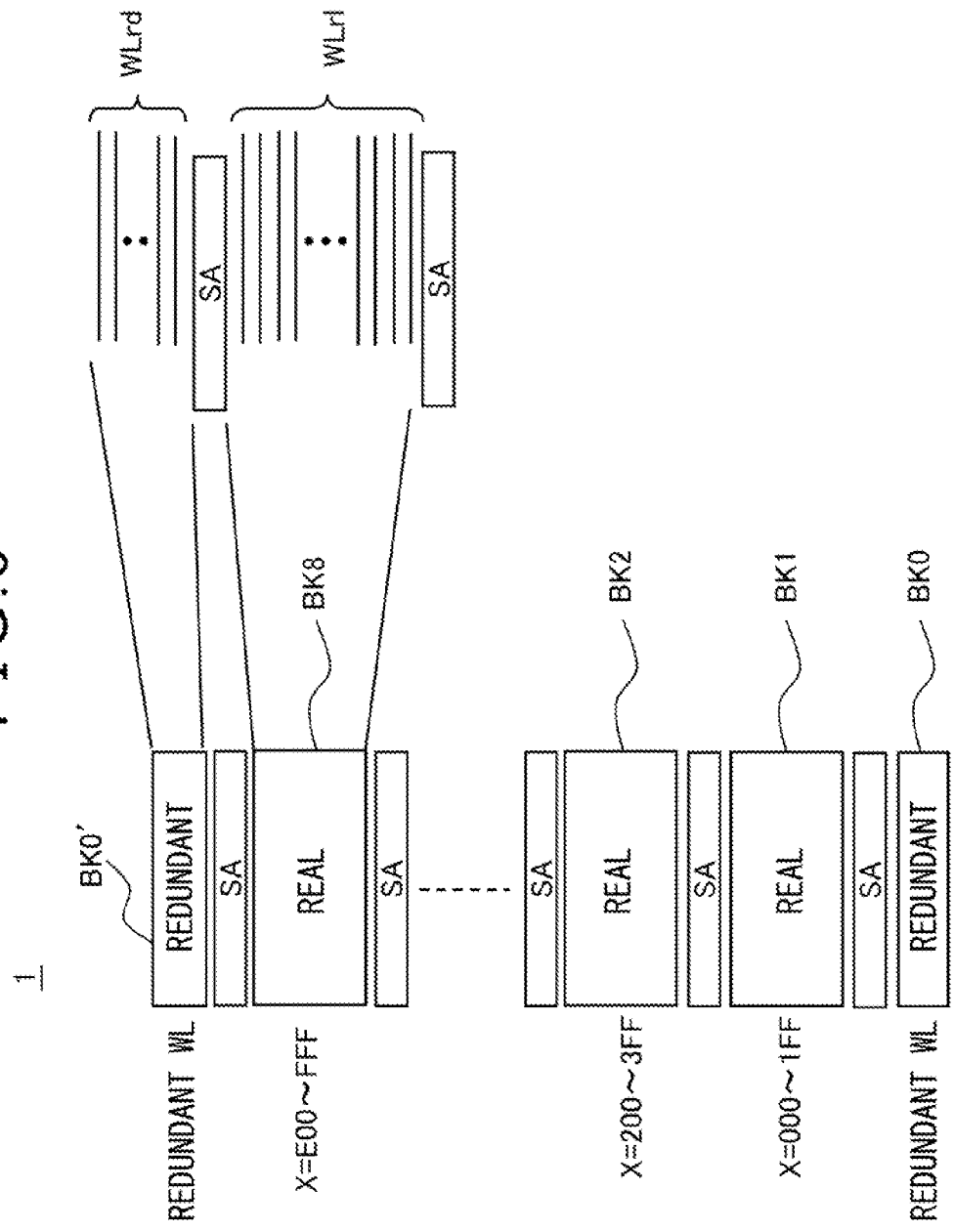
FIG. 6 is a diagram for explaining the open bit line core architecture and power management employed in a semiconductor storage device according to the present embodiments.

Embodiments of the semiconductor storage device will be described in detail below with reference to the accompanying drawings. FIG. 6 is a diagram for explaining the open bit line core architecture and power management employed in the semiconductor storage device of the present embodiments.

As is apparent from a comparison between FIG. 6 and FIG. 5 described above, in the semiconductor storage device of the present embodiments, the array blocks in the core (memory cell array) 1 are arranged in order from the array block BK1 with the addresses X=000 to 1FF to the array block BK8 with the addresses X=E00 to FFF.

In addition, an array block BK0 which contains only redundant cells (redundant word lines) is arranged underneath the lower sense amplifier SA of the array block BK1, and an array block BK0' which contains only redundant cells is arranged above the upper sense amplifier SA of the array block BK8.

Here, the array blocks BK1 to BK8 are array blocks containing only real cells (real word lines).

That is, the array blocks BK1 to BK8 contain only real word lines WLrl, and the array blocks BK0 and BK0' contain only redundant word lines WLrd.

In this way, in the semiconductor storage device of the present embodiments, the redundant word lines WLrd are provided only in the edge array blocks (BK0 and BK0'), eliminating the need to provide redundant word lines WLrd in the other array blocks (BK1 to BK8) and thereby achieving a reduction in the area they occupy.

In the semiconductor storage device of FIG. 6, the number of array blocks is 10 (BK1 to BK8, BK0, and BK0'), which is larger by 1 than the number of array blocks, 9, (BK11 to BK18 and BK11') in the semiconductor storage device earlier described with reference to FIG. 5.

However, the increase in the number of array blocks may be offset by the elimination of real word lines in the edge array blocks BK0 and BK0' and the elimination of redundant word lines in the other array blocks BK1 to BK8.

That is, the area corresponding to the total number of redundant word lines WLrd in the array blocks BK11 to BK18 and BK11' in the semiconductor storage device of FIG. 5 may be eliminated. In the semiconductor storage device of FIG. 6, the number of sense amplifiers increases by one compared with the configuration of the semiconductor storage device depicted in FIG. 5, but this increase is negligible compared with the reduction in area achieved by the reduction in the number of memory cells MCs (word lines WLs).

Furthermore, according to the semiconductor storage device of the present embodiments, since the redundant areas (array blocks BK0 and BK0' for redundant cells) are provided only in the edge portions, the probability of the edge blocks being accessed decreases. Theoretically, if no redundant cells (redundant word lines) are used, the probability of the edge blocks being accessed decreases to zero.

Figure 7:
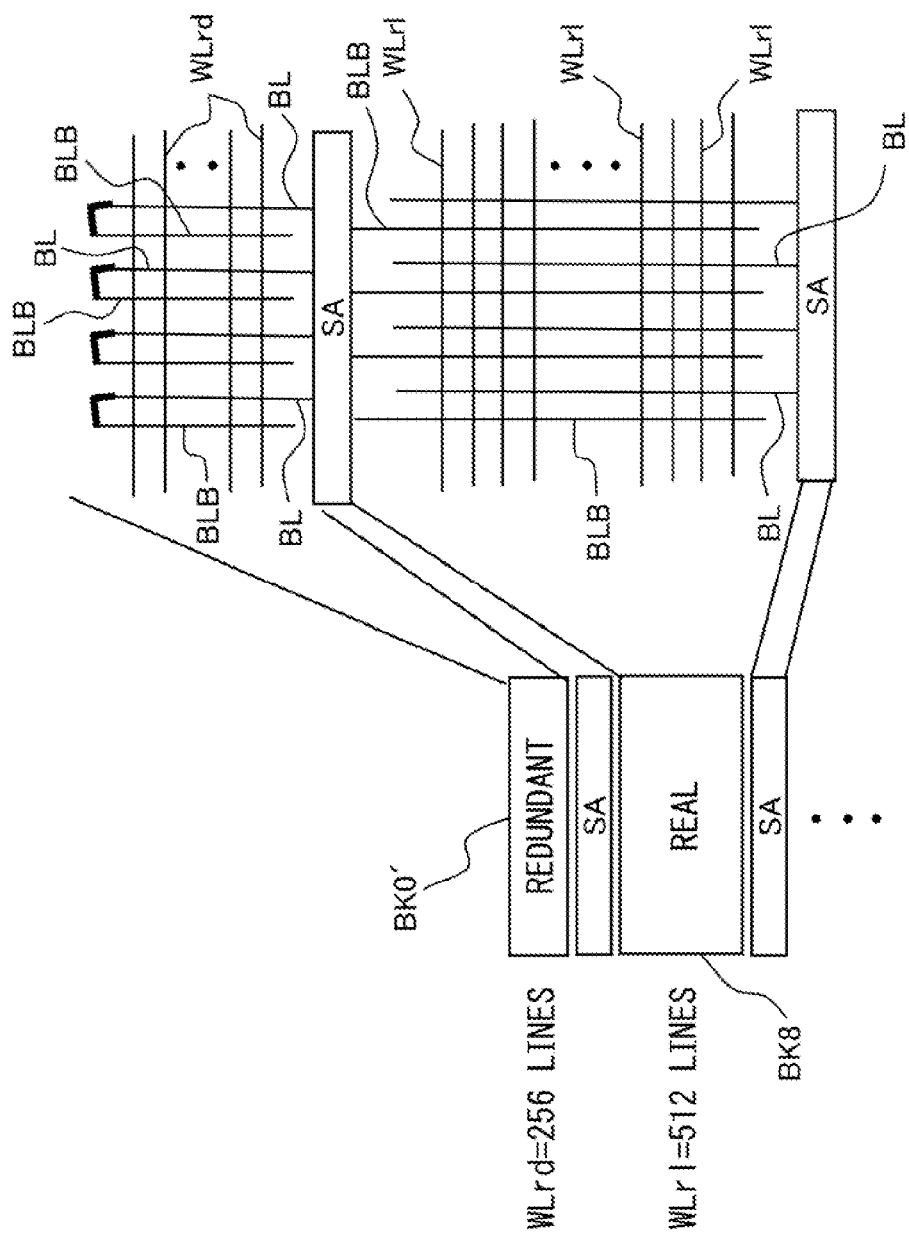
FIG. 7 is a diagram illustrating in further detail the core architecture employed in the semiconductor storage device of FIG. 6.

FIG. 7 is a diagram illustrating in further detail the core architecture employed in the semiconductor storage device of FIG. 6. In FIG. 7, the array block BK0' in the upper edge portion of FIG. 6 is particularly depicted, but basically the same illustration applies to the array block BK0 in the lower edge portion.

As illustrated in FIG. 7, in the redundant array block BK0', for example, any two adjacent bit lines BL and BLB are short-circuited at one end, and each bit line BL is coupled to the sense amplifier located on one side of the redundant array block BK0'.

That is, in the array block BK0', each bit line BL is coupled to the sense amplifier located between the array block BK0' and the array block BK8, while on the other hand, each bit line BLB is short-circuited to its adjacent bit line BL at the end thereof farthest from the end coupled to the sense amplifier SA.

With this arrangement, the capacitance (parasitic capacitance) of each bit line BL in the array block BK0' is made substantially the same as that of each bit line BL (BLB) in the array blocks BK11 to BK18.

Each memory cell (MC) is formed at the intersection between each bit line BL or BLB and redundant word line WLrd.

On the other hand, in the real array block BK8, for example, the bit lines BL and BLB in each adjacent pair are each coupled to one of two different sense amplifiers SAs located on both sides of the real array block BK8.

Each memory cell (MC) is formed at the intersection between each bit line BL or BLB and real word line WLrl.

Here, in the redundant array block BK0' in the edge portion, the number of redundant word lines WLrd may be set, for example, to 256, which is one half of the number of real word lines WLrl (512 lines) in the real array block BK8. Similarly to the real array block BK8, the other real array blocks BK1 to BK7 each contain 512 real word lines WLrl.

Figure 8:
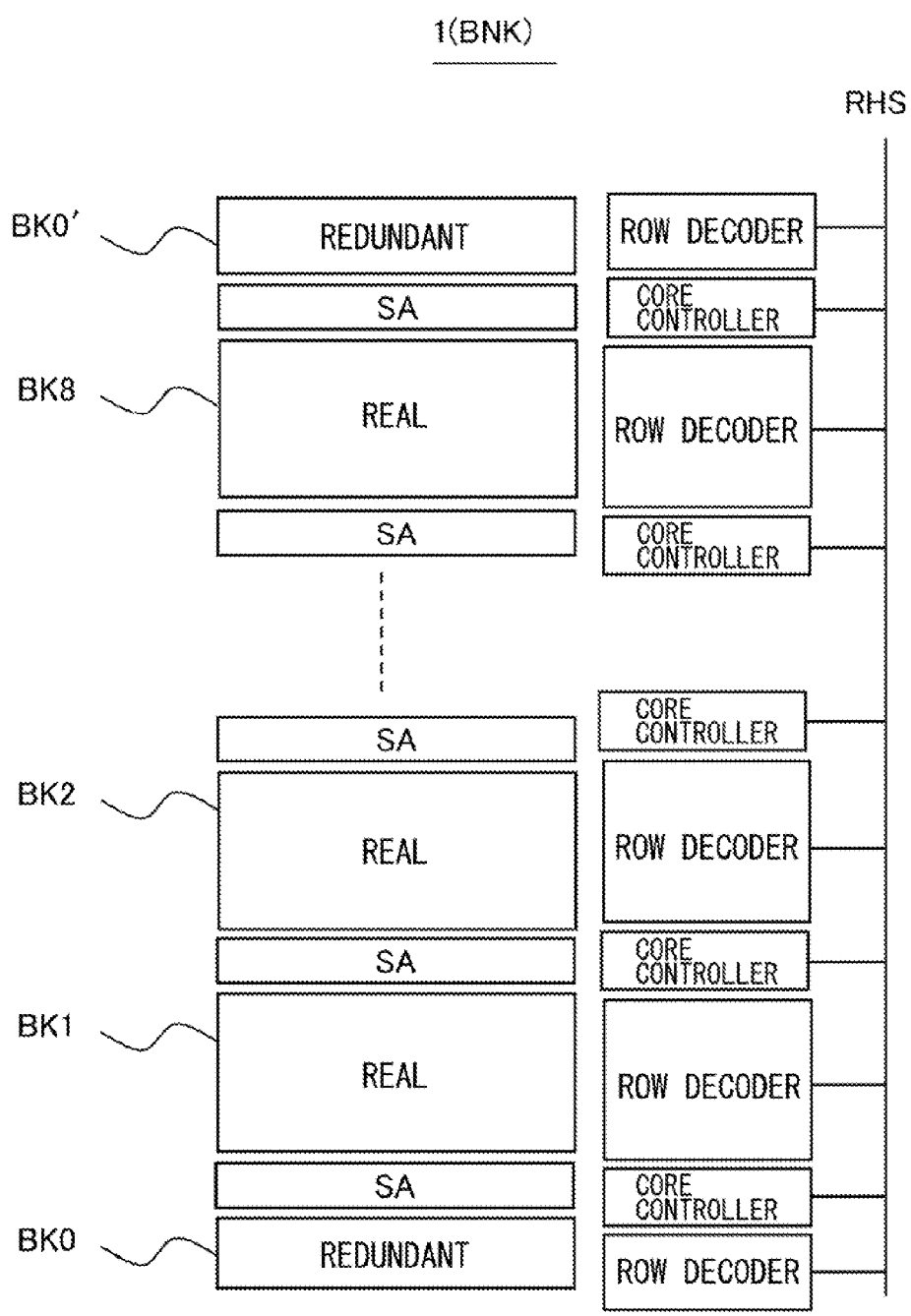
FIG. 8 is a diagram for explaining the operation of the semiconductor storage device of FIG. 6.

FIG. 8 is a diagram illustrating one memory cell array 1 (one bank BNK) for explaining the operation of the semiconductor storage device of FIG. 6.

As illustrated in FIG. 8, the array blocks BK1 to BK8 for the real cells, the array blocks BK0 and BK0' for the redundant cells, and the sense amplifiers SAs are controlled by row decoders and core controllers under the control of a redundancy hit signal RHS.

The redundancy hit signal RHS is a signal that indicates whether the access is to a redundant line (a redundant word line WLrd in the array block BK0 or BK0') or not, and that changes state, for example, when a real word line WLrl is replaced by a redundant word line WLrd.

More specifically, the redundancy hit signal RHS is normally at a high level "H", and remains "H" when a real word line WLrl is selected; however, when a redundant word line WLrd is selected, that is, when a real word line WLrl is replaced by a redundant word line WLrd, the redundancy hit signal RHS changes to a low level "L".

Then, in each embodiment, power management is performed by varying the amount of power supply in accordance with the redundancy hit signal RHS, as will be described below. To replace a defective real word line WLrl by a redundant word line WLrd, various known processing operations are applicable but the description thereof will not be given here.

Figure 9:
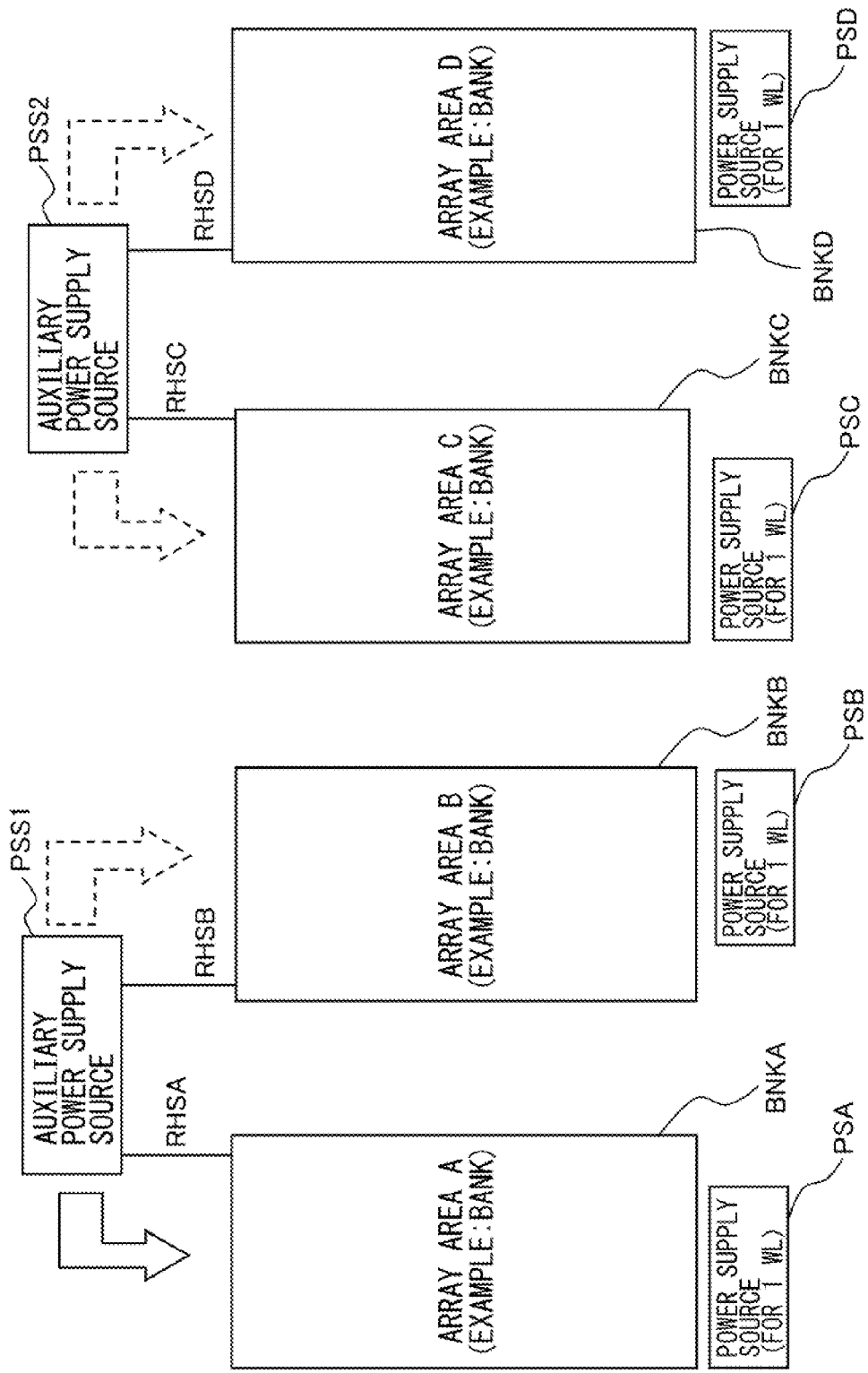
FIG. 9 is a block diagram illustrating one example of the semiconductor storage device of the present embodiments.

FIG. 9 is a block diagram illustrating one example of the semiconductor storage device of the present embodiments, in which the semiconductor storage device includes four array areas A to D. The array areas (banks) BNKA to BNKD each correspond to the bank BNK depicted in FIG. 8.

As illustrated in FIG. 9, the banks BNKA to BNKD are provided with power supply sources PSA to PSD, respectively, each of which is capable of supplying power for one word line WL.

Further, one auxiliary power supply source (power supply capacity control unit) PSS1 is provided for the two banks BNKA and BNKB, and one auxiliary power supply source (power supply capacity control unit) PSS2 is provided for the two banks BNKC and BNKD.

In the example of FIG. 9, the auxiliary power supply source PSS1 supplies power to the bank BNKA when a real word line WLrl is replaced by a redundant word line WLrd.

That is, in the semiconductor storage device of the present embodiments, one auxiliary power supply source PSS1 (PSS2) is shared, for example, between the two banks BNKA and BNKB (BNKC and BNKD), and power supply is controlled in accordance with the redundancy hit signal RHS.

Here, the auxiliary power supply source PSS1 (PSS2) is designed to have, for example, the capacity (power capacity) capable of supplying power for one word line WL.

That is, there is not much probability that real word lines WLrl of the same address in different banks are simultaneously rendered defective and replaced by redundant word lines WLrd, and there is therefore hardly any problem if one auxiliary power supply source is shared between two banks.

More specifically, different banks are accessed simultaneously, for example, when performing refresh operations, but presumably it is rare that real word lines WLrl of the same address in the different banks are simultaneously rendered defective and replaced by redundant word lines WLrd.

Furthermore, for example, in burst operations, etc., it is also rare in terms of probability that the real word line WLrl to be selected is replaced by a redundant word line WLrd successively a plurality of times. Accordingly, the number of banks that share one auxiliary power supply source PSS1 (PSS2) need not be limited to two, but one auxiliary power supply source may be shared by a larger number of banks, as will be described later.

It is also possible to appropriately change the capacity of the auxiliary power supply source PSS or the number of banks to share it, according to the degree of maturity of the technology applied to the semiconductor storage device of the present embodiments. Thus, according to the semiconductor storage device of the present embodiments, the overall power supply capacity may be reduced, and hence, the area of the power supply (power area) may also be reduced.

Figure 10:
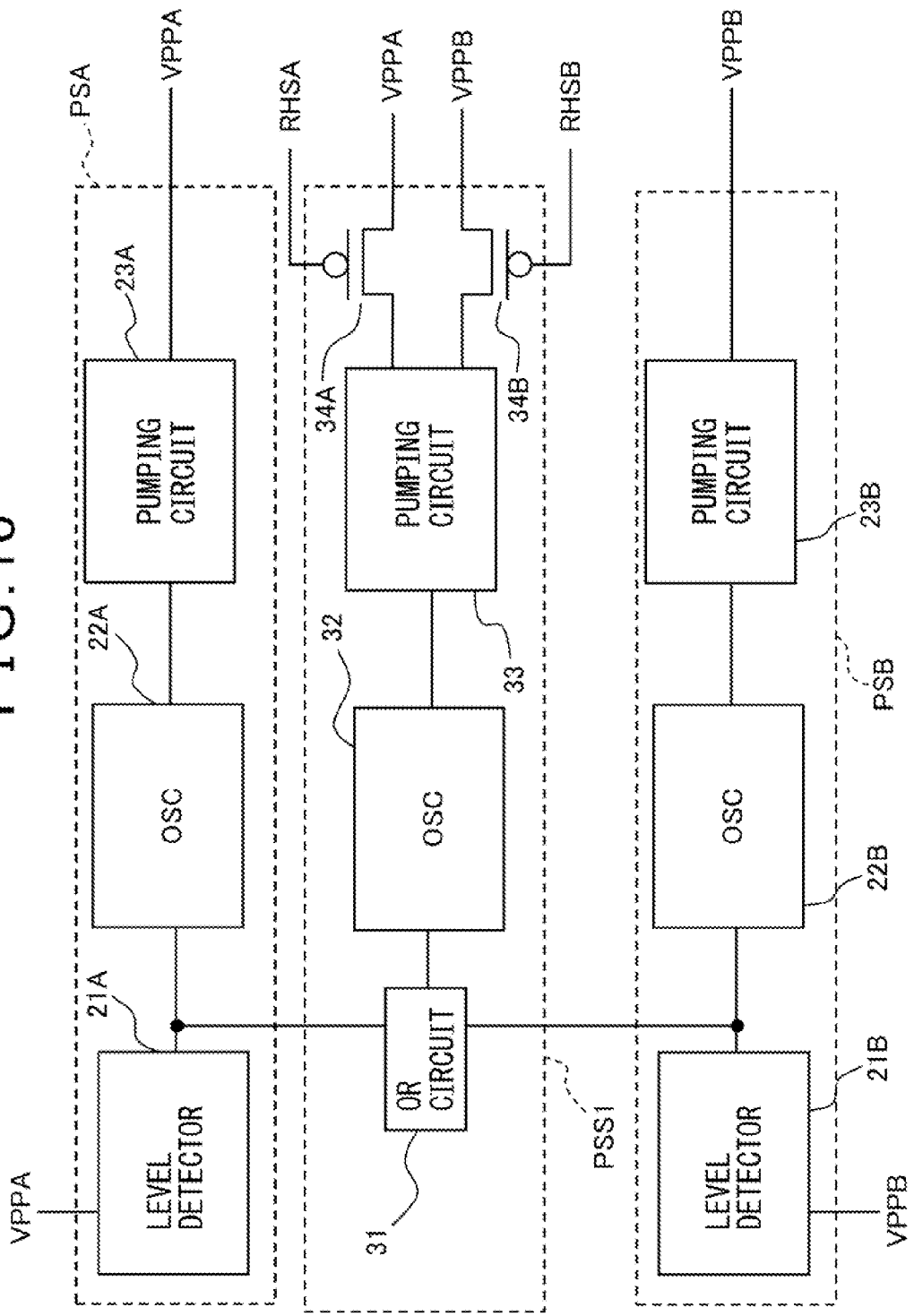
FIG. 10 is a block diagram for explaining the semiconductor storage device according to a first embodiment.

FIG. 10 is a block diagram for explaining the semiconductor storage device according to a first embodiment; the power supply sources PSA and PSB in FIG. 9 are depicted here along with the auxiliary power supply source PSS1. Here, reference character VPPA designates the supply voltage to the bank BNKA, and VPPB denotes the supply voltage to the bank BNKB.

As illustrated in FIG. 10, the power supply source PSA for the bank BNKA includes a level detector 21A, an oscillator (OSC) 22A, and a pumping circuit 23A. Likewise, the power supply source PSB for the bank BNKB includes a level detector 21B, an oscillator 22B, and a pumping circuit 23B.

The auxiliary power supply source PSS1 provided for the banks BNKA and BNKB includes an OR circuit 31, an oscillator 32, a pumping circuit 33, and switches (pMOS transistors) 34A and 34B.

The level detector 21A detects the level of the supply voltage VPPA to the bank BNKA, and controls the oscillator 22A so that the voltage VPPA is set to a prescribed level by the output voltage (step-up voltage) of the pumping circuit 23A.

Likewise, the level detector 21B detects the level of the supply voltage VPPB to the bank BNKB, and controls the oscillator 22B so that the voltage VPPB is set to a prescribed level by the output voltage of the pumping circuit 23B.

Here, the outputs of the level detectors 21A and 21B are supplied as inputs to the OR circuit 31 in the auxiliary power supply source PSS1, and if at least one of the supply voltages VPPA and VPPB is lower than the prescribed level, the pumping circuit 33 is operated by controlling the oscillator 32.

When word line redundancy switching is performed to replace a real word line WLrl by a redundant word line WLrd, for example, in the bank BNKA, the transistor 34A turns on in response to the "H" to "L" change of the redundancy hit signal RHSA of the bank BNKA. As a result, the output voltage of the pumping circuit 33 is added to the supply voltage VPPA to increase the power supply capacity.

Likewise, when word line redundancy switching is performed to replace a real word line WLrl by a redundant word line WLrd, for example, in the bank BNKB, the transistor 34B turns on in response to the "H" to "L" change of the redundancy hit signal RHSB of the bank BNKB. As a result, the output voltage of the pumping circuit 33 is added to the supply voltage VPPB to increase the power supply capacity.

Here, the auxiliary power supply source PSS1 has, for example, the capacity capable of supplying power for one word line WL.

Here, the same auxiliary power supply source PSS1 is shared between the two banks BNKA and BNKB, because there is little probability that real word lines WLrl of the same address in both of the banks are simultaneously rendered defective and replaced by redundant word lines WLrd.

Furthermore, for example, in burst operations, etc., it is also very rare that, in the two banks BNKA and BNKB, the real word line WLrl to be selected is replaced by a redundant word line WLrd successively a plurality of times, and there arises no problem in practice.

Figure 11:
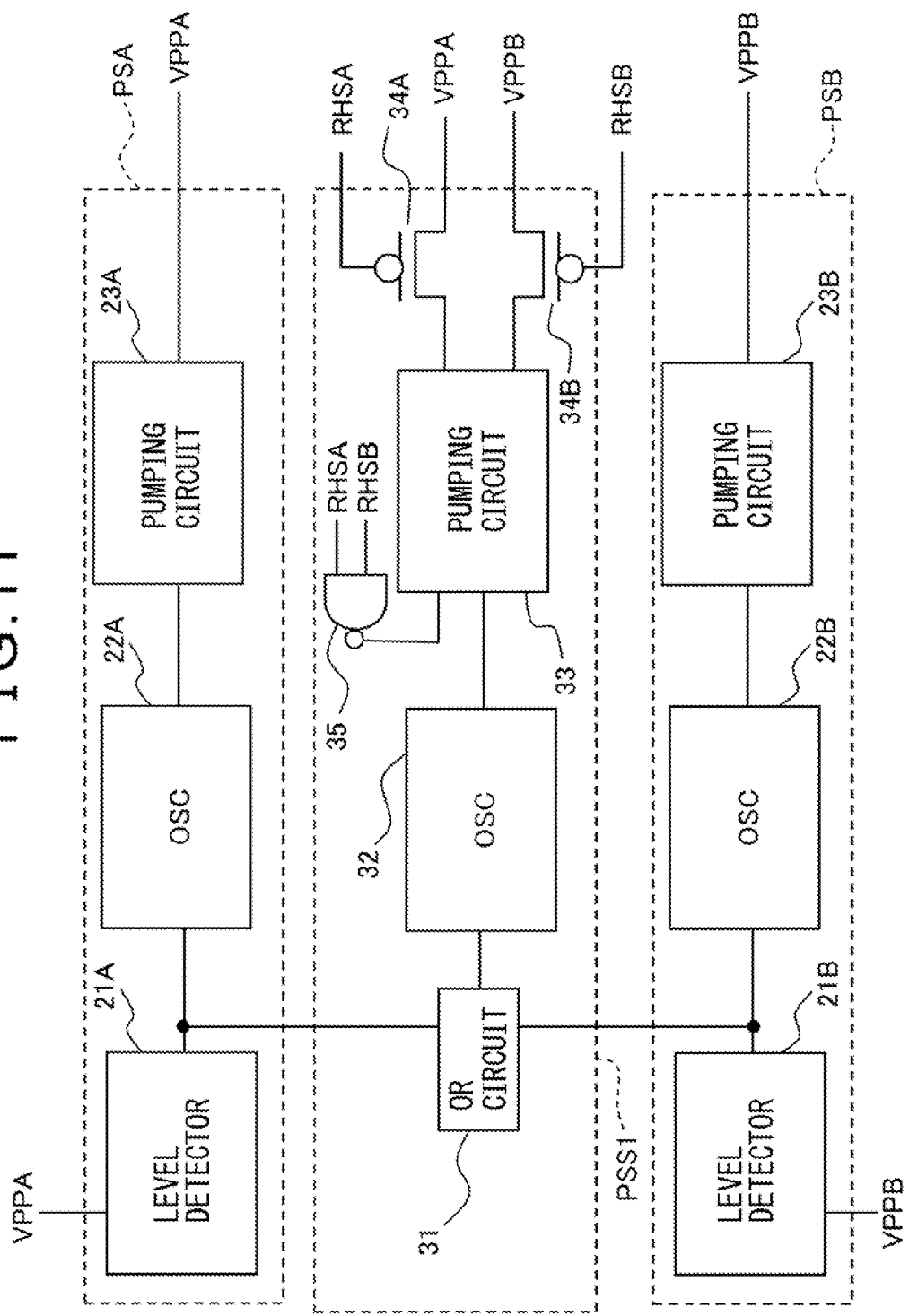
FIG. 11 is a block diagram illustrating a modified example of the semiconductor storage device of FIG. 10.

FIG. 11 is a block diagram illustrating a modified example of the semiconductor storage device of FIG. 10. As is apparent from a comparison between FIG. 11 and FIG. 10 described above, the modified example differs by the inclusion of a NAND gate 35 which takes the redundancy hit signals RHSA and RHSB as inputs.

The operation of the pumping circuit 33 is controlled by the output of the NAND gate 35. That is, when word line redundancy switching is performed in at least one of the banks BNKA and BNKB, at least one of the redundancy hit signals RHSA and RHSB changes from "H" to "L", and the output of the NAND gate 35 goes to "H".

When the output of the NAND gate 35 goes to "H", the pumping circuit 33 turns on, but when the output remains "L", that is, when word line redundancy switching is performed in neither of the banks BNKA and BNKB, the pumping circuit 33 remains off, thus reducing wasteful power consumption.

In FIG. 11, the on/off operation of the pumping circuit 33 is controlled by the output of the NAND gate 35 that takes the redundancy hit signals RHSA and RHSB as inputs, but alternatively, provisions may be made, for example, to turn off the operation of the oscillator 32 at the preceding stage.

Figure 12:
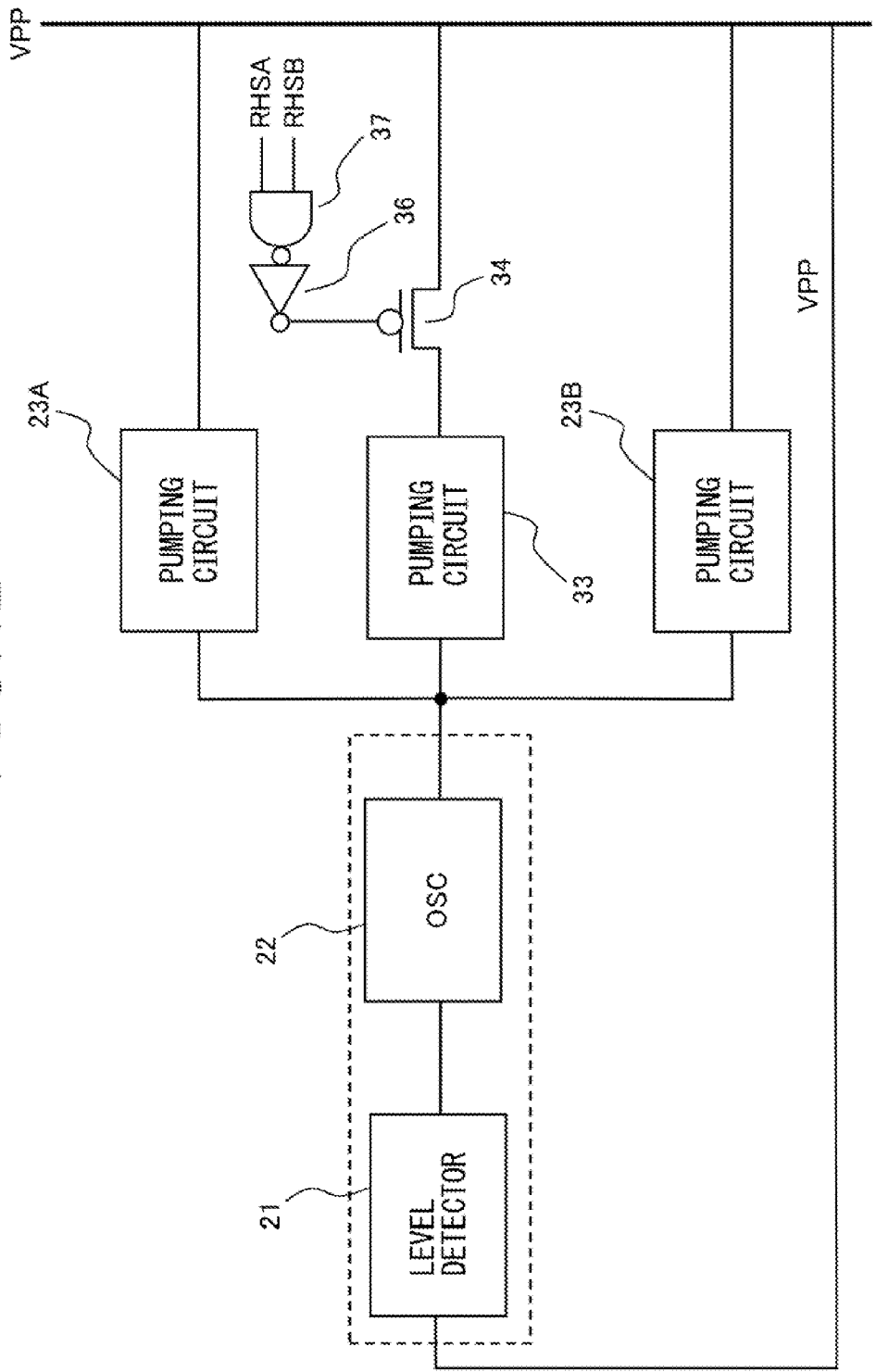
FIG. 12 is a block diagram for explaining the semiconductor storage device according to a second embodiment.

FIG. 12 is a block diagram for explaining the semiconductor storage device according to a second embodiment. In the second embodiment, the power supply line is common to the banks BNKA and BNKB and provides a common supply voltage VPP.

As illustrated in FIG. 12, in the semiconductor storage device of the second embodiment, the level detector 21 and the oscillator 22 are shared among the power supply sources PSA and PSB and the auxiliary power supply source PSS1, thereby aiming to reduce the power consumption of the power supply sources as well as the area they occupy.

The output voltage of the pumping circuit 33 in the auxiliary power supply source PSS1 is coupled to the power supply line via a switch (pMOS transistor) 34. Here, an output of a NAND date 37 is supplied to the gate of the transistor 34 via an inverter 36 so that the transistor 34 turns on when at least one of the redundancy hit signals RHSA and RHSB changes from "H" to "L".

That is, when word line redundancy switching is performed in at least one of the banks BNKA and BNKB, the transistor 34 turns on and the output voltage of the pumping circuit 33 is added to the supply voltage VPP to increase the power supply capacity.

Figure 13:
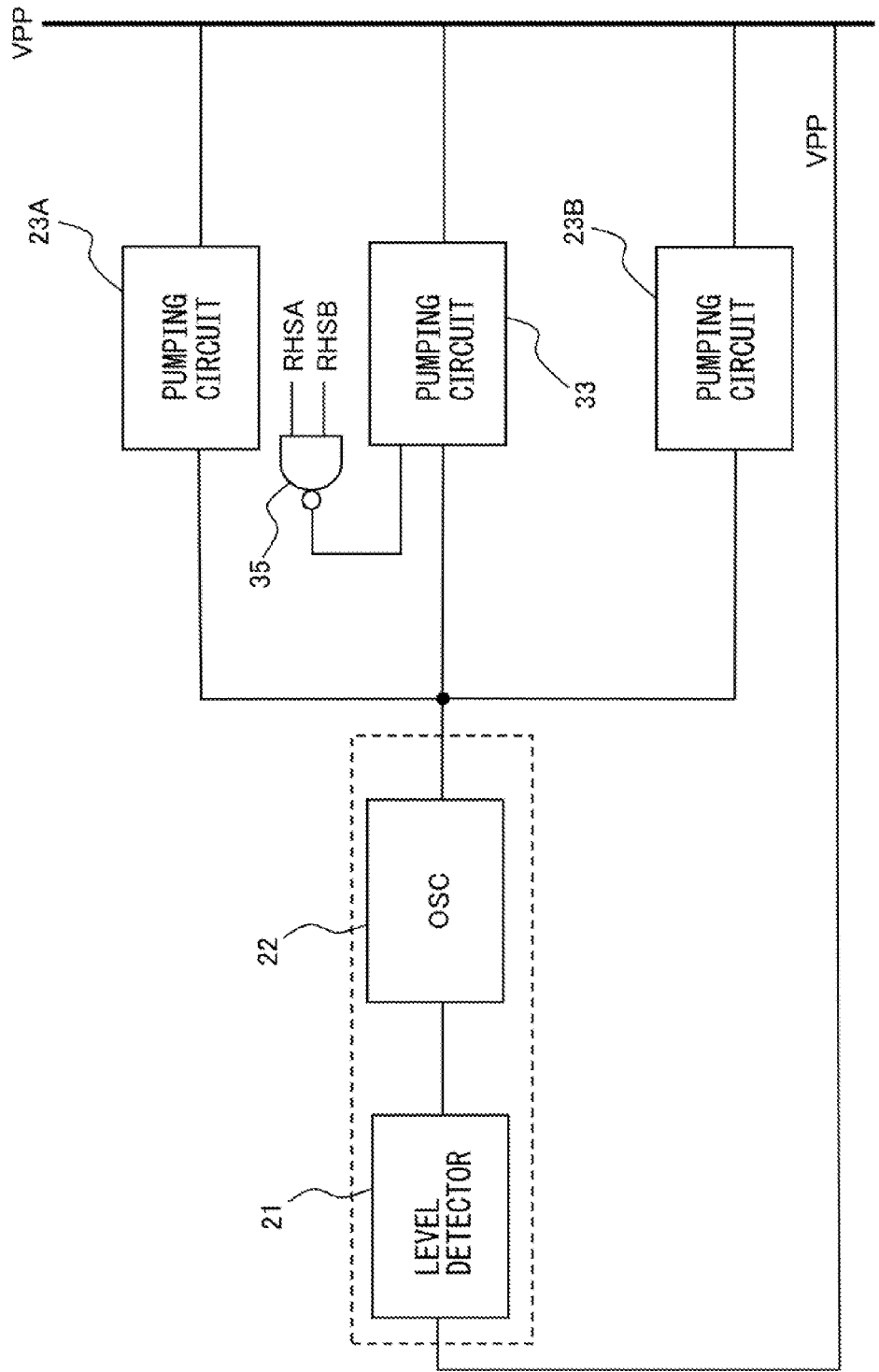
FIG. 13 is a block diagram illustrating a modified example of the semiconductor storage device of FIG. 12.

FIG. 13 is a block diagram illustrating a modified example of the semiconductor storage device of FIG. 12; in this example, as in the semiconductor storage device earlier described with reference to FIG. 11, wasteful power consumption is reduced by controlling the operation of the pumping circuit 33 by the output of the NAND gate 35.

In the semiconductor storage device of FIG. 13, the output voltage of the pumping circuit 33 is added to the supply voltage VPP directly, not via the transistor (switch) 34.

Figure 14:
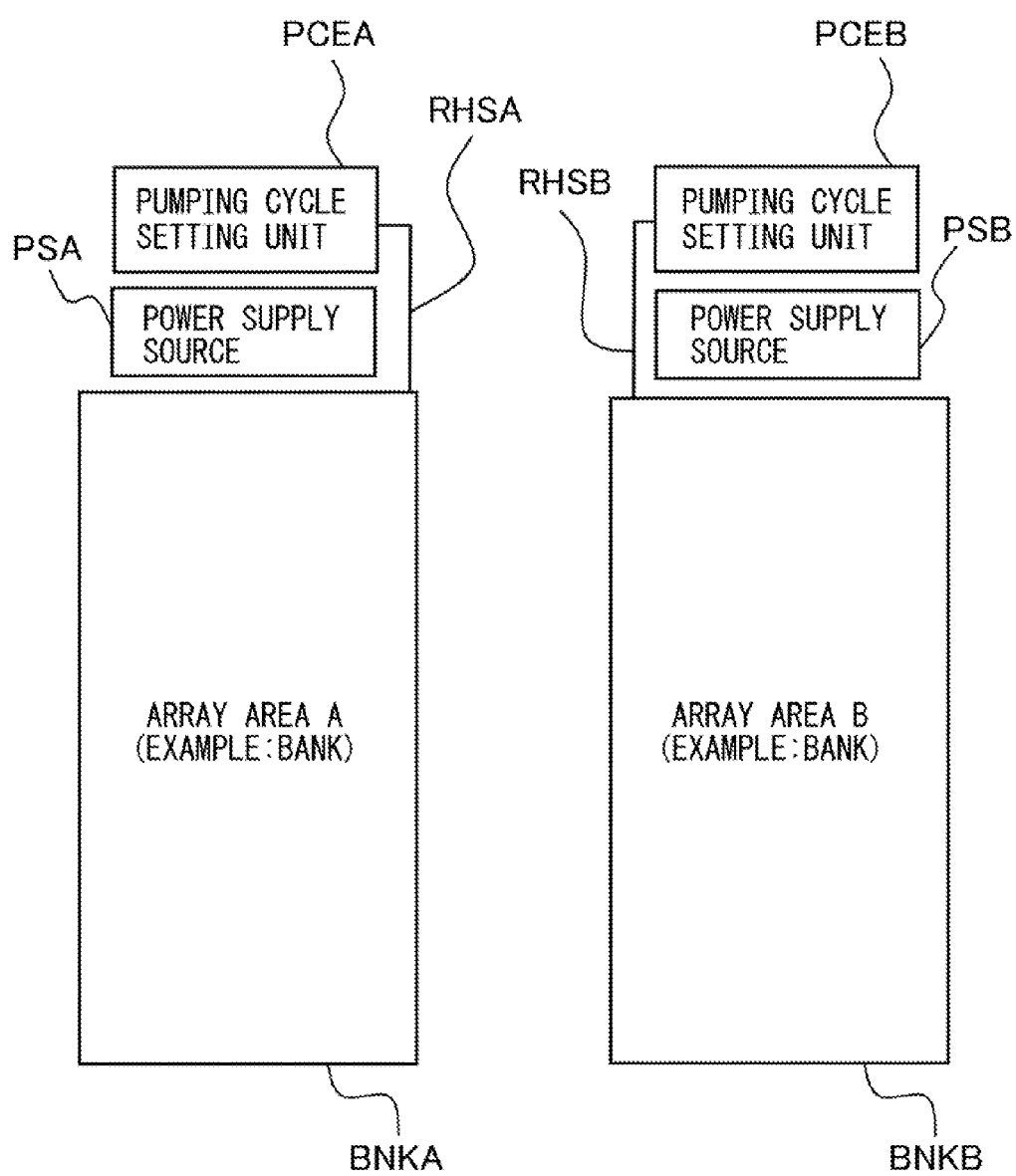
FIG. 14 is a block diagram for explaining the semiconductor storage device according to a third embodiment.

FIG. 14 is a block diagram for explaining the semiconductor storage device according to a third embodiment. As illustrated in FIG. 14, in the semiconductor storage device of the third embodiment, the power supply capabilities of the power supply sources PSA and PSB are controlled by the redundancy hit signals RHSA and RHSB, respectively, without having to provide any auxiliary power supply sources.

That is, the banks BNKA and BNKB are provided with pumping cycle setting units PCEA and PCEB, respectively, and when word line redundancy switching is performed in accordance with the redundancy hit signal RHSA or RHSB, the pumping cycle is set shorter and the power supply capability is thus increased.

In FIG. 14, only two banks BNKA and BNKB are depicted, but if this embodiment is applied, for example, to the example of FIG. 9, similar pumping cycle setting units are also provided for the other two banks BNKC and BNKD, to control the power supply capabilities of the respective power supply sources PSC and PSD.

Figure 15:
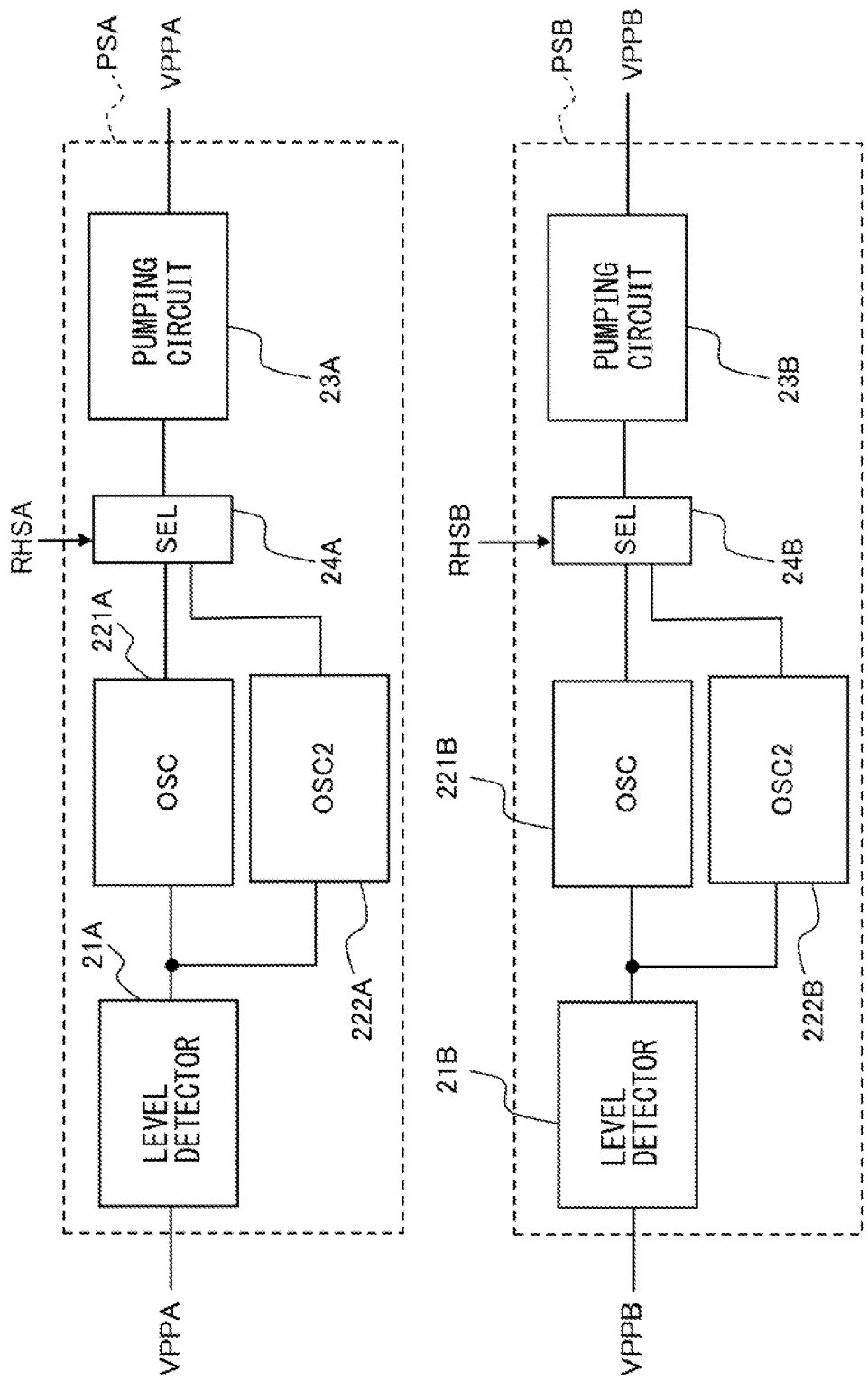
FIG. 15 is a block diagram illustrating one example of the semiconductor storage device of FIG. 14.

FIG. 15 is a block diagram illustrating one example of the semiconductor storage device of FIG. 14, and more particularly one example of the power supply source (power supply capacity control unit) PSA, PSB. Since the power supply sources PSA and PSB are identical in configuration, the following description deals with the power supply source PSA.

As illustrated in FIG. 15, the power supply source PSA includes two oscillators 221A and 222A and a selector 24A which is controlled by the redundancy hit signal RHSA. The oscillation frequency of the oscillator 222A is higher than that of the oscillator 221A (for example, twice as high), and when the redundancy hit signal RHSA, for example, goes to "L", the selector 24A selects the output of the oscillator 222A.

That is, when word line redundancy switching is performed in the bank BNKA, the redundancy hit signal RHSA goes to "L", in response to which the selector 24A selects the output of the oscillator 222A producing the higher frequency. This causes the pumping circuit 23A to perform the pumping operation at the higher frequency (for example, twice the usual frequency) thereby increasing the power supply capability.

Figure 16:
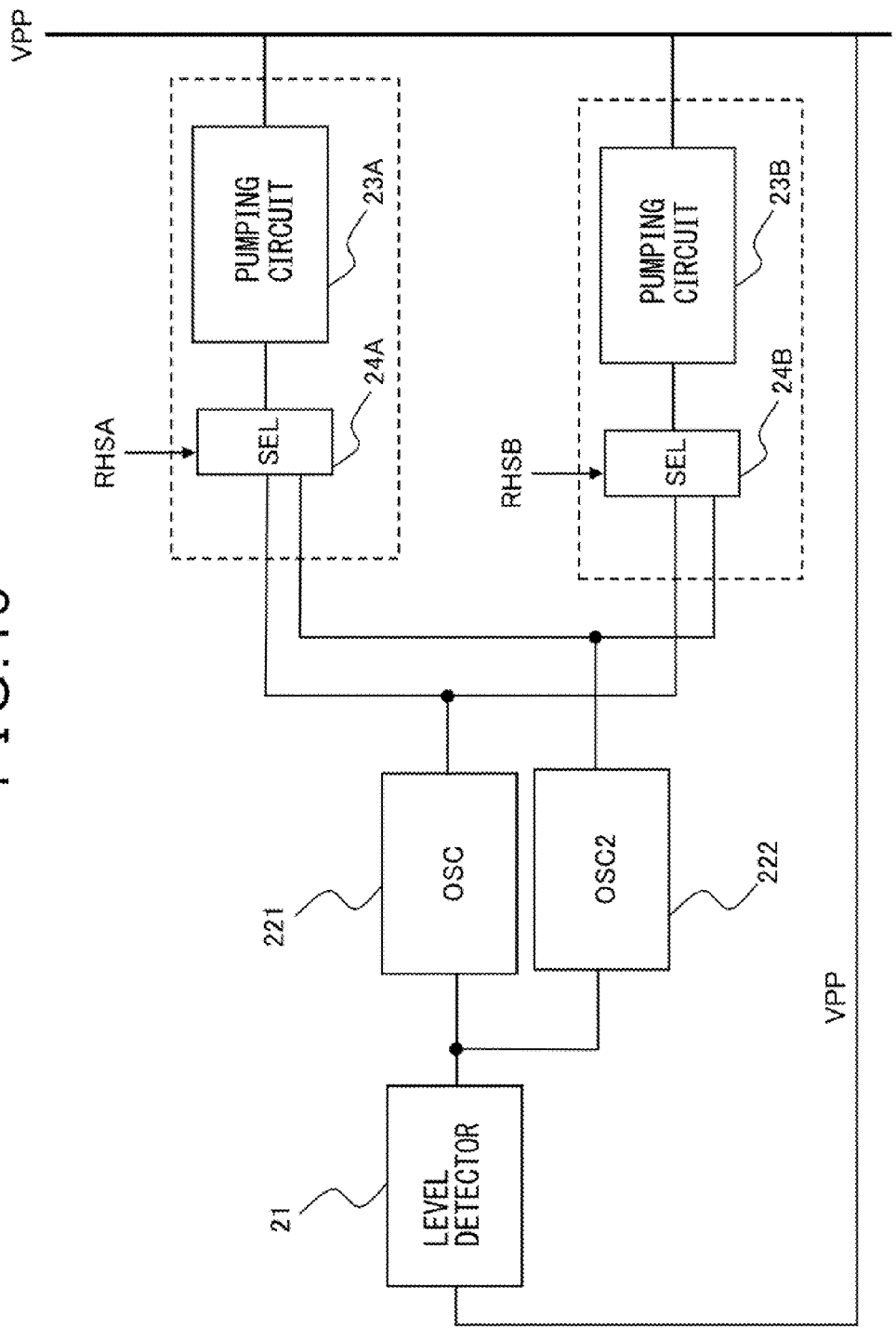
FIG. 16 is a block diagram illustrating a modified example of the semiconductor storage device of FIG. 15.

FIG. 16 is a block diagram illustrating a modified example of the semiconductor storage device of FIG. 15. As is apparent from a comparison between FIG. 16 and FIG. 15 described above, in the modified example the power supply line is common to the two banks BNKA and BNKB and provides a common supply voltage VPP.

Further, the level detector 21 and the oscillators 221 and 223 are shared between the two power supply sources (PSA and PSB) thereby aiming to reduce the power consumption of the power supply sources as well as the area they occupy.

Figure 17:
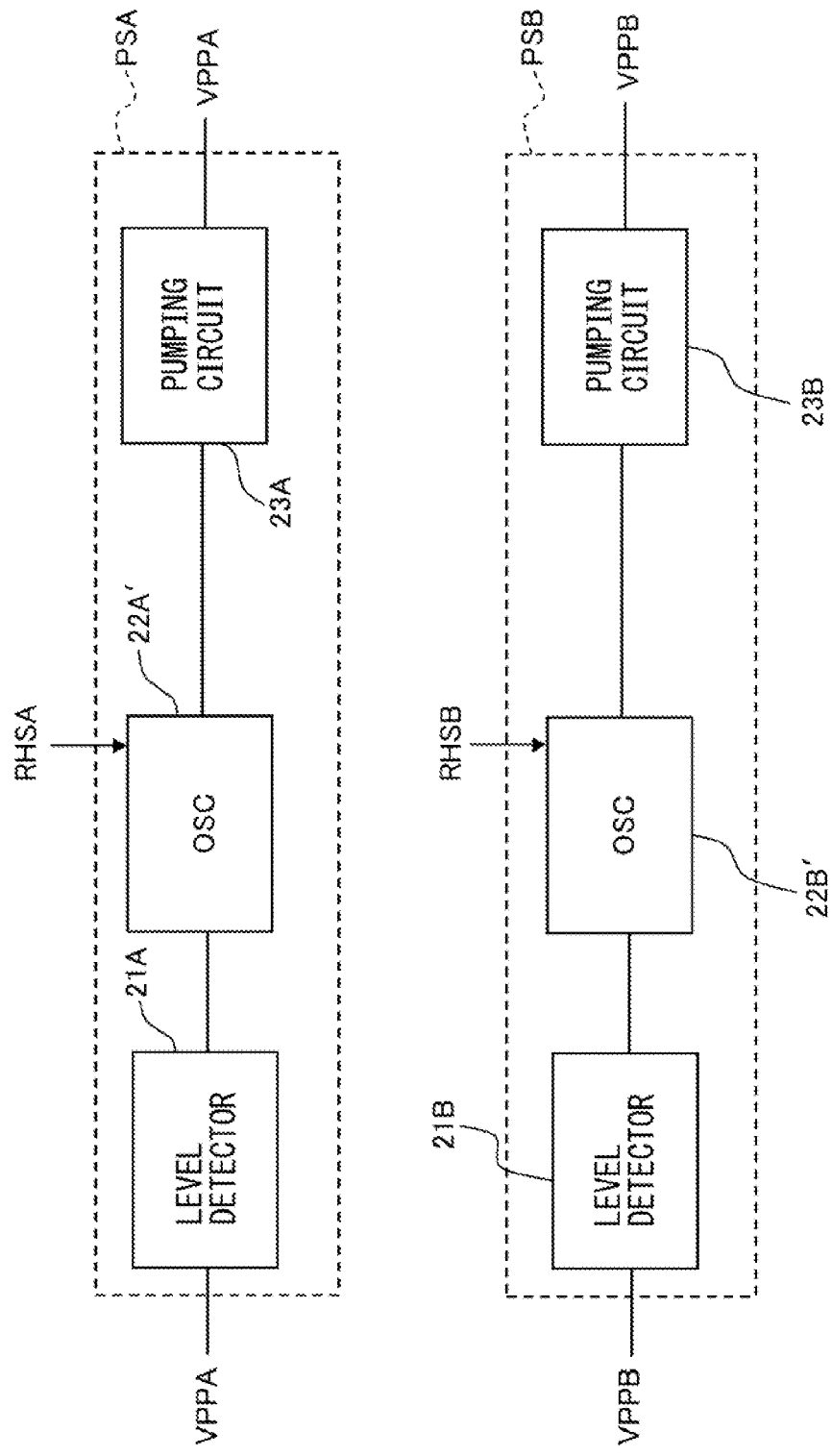
FIG. 17 is a block diagram illustrating another example of the semiconductor storage device of FIG. 14.

FIG. 17 is a block diagram illustrating another example of the semiconductor storage device of FIG. 14, in which the oscillators 22A' and 22B' in the respective power supply sources PSA and PSB incorporate the functions of the pumping cycle setting units PCEA and PCEB of FIG. 14, respectively.

That is, the redundancy hit signals RHSA and RHSB are supplied to the oscillators 22A' and 22B', respectively.

Figure 18:
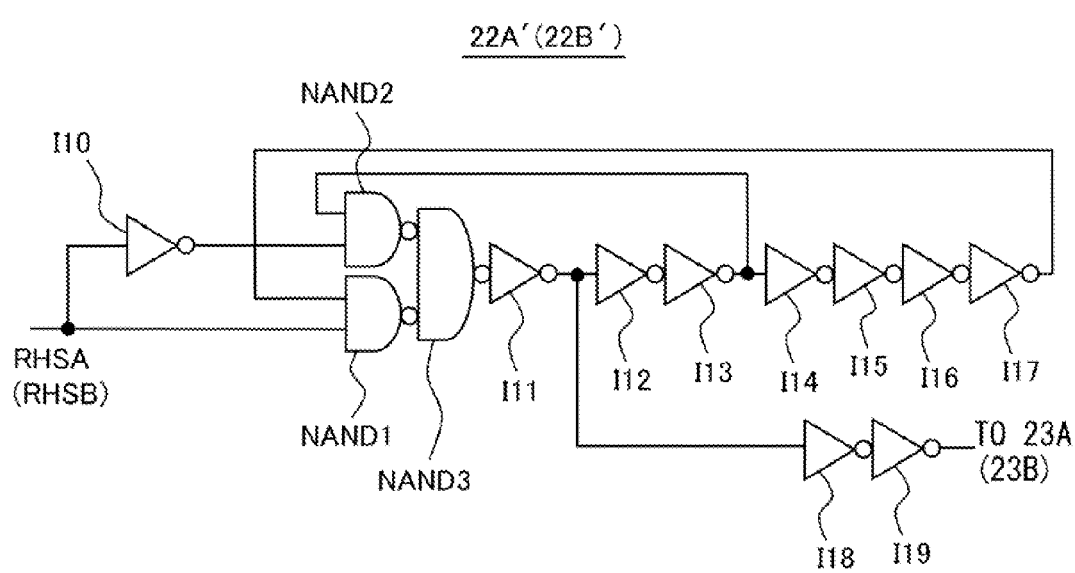
FIG. 18 is a circuit diagram illustrating one example of an oscillator in the semiconductor storage device of FIG. 17.

FIG. 18 is a circuit diagram illustrating one example of the oscillator in the semiconductor storage device of FIG. 17. As illustrated in FIG. 18, the oscillation period of the oscillator 22A' (22B') in the semiconductor storage device of FIG. 17 changes according to the level of the redundancy hit signal RHSA (RHSB). Since the oscillators 22A' and 22B' are identical in configuration, the following description deals with the oscillator 22A'.

The oscillator 22A' includes inverters I10 to I19 and NAND gates NAND1 to NAND3. Here, the output of the oscillator 22A' is produced by taking the output of the inverter I11 and waveshaping it through two stages of inverters I18 and I19, and the output is supplied to the pumping circuit 23A at the next stage.

When the redundancy hit signal RHSA is at "H", the output of the inverter I17 is fed back via the NAND gate NAND1, and the oscillator oscillates with the period corresponding to the delay time introduced through the NAND gates NAND1 and NAND3 and the inverters I11 to I17.

On the other hand, when the redundancy hit signal RHSA is at "L", the output of the inverter I13 is fed back via the NAND gate NAND2, and the oscillator oscillates with the period corresponding to the delay time introduced through the NAND gates NAND2 and NAND3 and the inverters I11 to I13.

Accordingly, when word line redundancy switching is not performed, that is, when the redundancy hit signal RHSA is at "H", the oscillator outputs the oscillator signal with the longer period determined by the NAND gates NAND1 and NAND3 and the inverters I11 to I17.

On the other hand, when word line redundancy switching is performed, that is, when the redundancy hit signal RHSA is at "L", the oscillator outputs the oscillator signal with the shorter period determined by the NAND gates NAND2 and NAND3 and the inverters I11 to I13 (for example, the signal whose oscillation frequency is twice as high as the frequency when RHSA is at "H").

It will, however, be recognized that the oscillator 22A', 22B' whose oscillation frequency changes according to the redundancy hit signal RHSA, RHSB is not limited to the above specific circuit but may be implemented by various other circuits.

FIG. 19 is a block diagram for explaining the semiconductor storage device according to a fourth embodiment. As illustrated in FIG. 19, the banks BNKA to BNKD (array areas A to D) are provided with power supply sources PSA to PSD, respectively, each of which is capable of supplying power for one word line WL.

Further, in the semiconductor storage device of the fourth embodiment, one auxiliary power supply source PSS is provided for the four banks BNKA to BNKD. Here, the auxiliary power supply source PSS is designed to have, for example, the capacity capable of supplying power for one and a half word lines WLs.

That is, in the earlier described semiconductor storage device of FIG. 9, one auxiliary power supply source PSS1 (PSS2) having the capacity capable of driving one word line WL has been provided for each pair of banks BNKA and BNKB (BNKC and BNKD).

By contrast, in the semiconductor storage device of the fourth embodiment, one auxiliary power supply source PSS having the capacity capable of driving one and a half word lines WLs is provided for the four banks BNKA to BNKD.

Here, the probability of real word lines WLrl of the same address in the four different banks being simultaneously rendered defective and replaced by redundant word lines WLrd is, for example, much lower than the probability of occurring in the case of two banks previously described with reference to FIG. 9.

In view of this, in the fourth embodiment, the capacity of the auxiliary power supply source PSS is not set equal to the capacity of two word lines WLs, i.e., the combined capacity of the auxiliary power supply sources PSS1 and PSS2, but set equal to the capacity of one hand a half word lines WLs, but this does not present any problem in practice.

The technical ideas of the above embodiments and modified examples may be applied in any suitable combination thereof. Further, the circuits of the auxiliary power supply source PSS (PPS1, PSS2) and the power supply source PS (PSA to PSD), etc., are not limited to the specific examples described with reference to the drawings, but may be implemented by various other circuits.

It will also be recognized that the number of banks (array areas) to share the auxiliary power supply source and the capacity of the auxiliary power supply source (power capacity) may be changed appropriately, for example, by considering the redundancy, etc. according to the degree of maturity of the manufacturing technology of the semiconductor storage device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor storage device including an open bit line core architecture, comprising:
a plurality of array areas, wherein
each of the array areas includes:
two redundant array blocks containing only redundant word lines among the redundant word lines and real word lines and located in edge portions at both ends of the array area;
a plurality of real array blocks containing only real word lines among the redundant word lines and real word lines and arranged between the two redundant array blocks by interposing a sense amplifier in alternating fashion; and
a power supply capacity control unit configured to increase power supply capacity for a first array area when word line redundancy switching is performed in the first array area to replace any one of the real word lines with a corresponding one of the redundant word lines.

2. The semiconductor storage device as claimed in claim 1, wherein each of the redundant array blocks contains a plurality of bit lines, any two adjacent lines of which are short-circuited at one end and are coupled to one sense amplifier located on one side of the redundant array block, and a plurality of redundant cells respectively formed at positions where the bit lines intersect with the redundant word lines, and
each of the real array blocks contains a plurality of bit lines, any two adjacent lines of which are each coupled to one of two different sense amplifiers located on both sides of the real array block, and a plurality of real cells respectively formed at positions where the bit lines intersect with the real word lines.

3. The semiconductor storage device as claimed in claim 1, wherein the power supply capacity control unit is an auxiliary power supply source provided for a plurality of array areas including the first array area, and
the auxiliary power supply source supplies its power supply output to the first array area in accordance with a redundancy hit signal generated when the word line redundancy switching is performed in the first array area.

4. The semiconductor storage device as claimed in claim 3, wherein the auxiliary power supply source is provided for two array areas including the first array area, and the power supply capacity of the auxiliary power supply source is set to provide power smaller than the power taken to drive two word lines.

5. The semiconductor storage device as claimed in claim 4, wherein the power supply capacity of the auxiliary power supply source is set to provide power substantially equal to the power taken to drive one word line.

6. The semiconductor storage device as claimed in claim 3, wherein the auxiliary power supply source is provided for four array areas including the first array area, and the power supply capacity of the auxiliary power supply source is set to provide power smaller than the power taken to drive two word lines.

7. The semiconductor storage device as claimed in claim 6, wherein the power supply capacity of the auxiliary power supply source is set to provide power substantially equal to the power taken to drive one and a half word lines.

8. The semiconductor storage device as claimed in claim 3, wherein the auxiliary power supply source includes a pumping circuit, and wherein when the word line redundancy switching is not performed in any one of the plurality of array areas, the pumping circuit in the auxiliary power supply source stops its pumping operation.

9. The semiconductor storage device as claimed in claim 1, wherein the power supply capacity control unit is a power supply source provided for the first array area, and
the power supply source increases its power supply capability for the first array area in accordance with a redundancy hit signal generated when the word line redundancy switching is performed in the first array area.

10. The semiconductor storage device as claimed in claim 9, wherein the power supply source includes an oscillator and a pumping circuit, and
when the word line redundancy switching is performed, the oscillator switches from a first oscillation frequency to a second oscillation frequency higher than the first oscillation frequency in accordance with the redundancy hit signal.

11. The semiconductor storage device as claimed in claim 9, wherein the power supply source includes a first oscillator operating at a first oscillation frequency, a second oscillator operating at a second oscillation frequency higher than the first oscillation frequency, and a pumping circuit, and when the word line redundancy switching is performed, the pumping circuit in the power supply source is driven by the second oscillation frequency from the second oscillator in accordance with the redundancy hit signal.

12. The semiconductor storage device as claimed in claim 10, wherein the second oscillation frequency is approximately twice the first oscillation frequency.

13. The semiconductor storage device as claimed in claim 1, wherein the plurality of array areas are provided with a common power supply line.

14. The semiconductor storage device as claimed in claim 1, wherein each of the array areas is a bank in a memory cell array.

* * * * *